(12) United States Patent
Gottshall et al.

(10) Patent No.: US 8,096,033 B2
(45) Date of Patent: Jan. 17, 2012

(54) REMANUFACTURE OF ELECTRONIC ASSEMBLIES

(75) Inventors: Paul C Gottshall, Washington, IL (US); Ulises Ramirez Wleschuver, Neuvo Laredo (MX)

(73) Assignee: Caterpillar Inc., Peoria, IL (US)

( * ) Notice: Subject to any disclaimer, the term of this patent is extended or adjusted under 35 U.S.C. 154(b) by 1107 days.

(21) Appl. No.: 11/935,211

(22) Filed: Nov. 5, 2007

(65) Prior Publication Data

US 2009/0115438 A1 May 7, 2009

(51) Int. Cl.
*B23P 19/04* (2006.01)
*B23P 6/00* (2006.01)

(52) U.S. Cl. ............... 29/402.08; 29/402.03; 29/762; 29/854; 324/756.01

(58) Field of Classification Search .......... 29/402.03, 29/402.04, 402.08, 426.4, 762, 830, 831, 29/854; 324/537, 754, 756.01
See application file for complete search history.

(56) References Cited

U.S. PATENT DOCUMENTS

| | | | |
|---|---|---|---|
| 3,815,806 A | 6/1974 | Paxton | |
| 4,101,066 A | 7/1978 | Corsaro | |
| 4,412,641 A | 11/1983 | Fuchs et al. | |
| 4,506,820 A | 3/1985 | Brucker | |
| 4,769,083 A | 9/1988 | Tiritilli | |
| 5,072,874 A | 12/1991 | Bertram | |
| 5,402,563 A | 4/1995 | Satoh et al. | |
| 6,192,570 B1 * | 2/2001 | Traver et al. | 29/426.4 |
| 6,256,478 B1 | 7/2001 | Allen et al. | |
| 6,257,478 B1 | 7/2001 | Straub | |
| 7,243,418 B2 * | 7/2007 | Murillo et al. | 29/762 |

FOREIGN PATENT DOCUMENTS

DE   3232368 A1   1/1984

* cited by examiner

*Primary Examiner* — Donghai D. Ngjuyen
(74) *Attorney, Agent, or Firm* — Leydig, Voit & Mayer

(57) ABSTRACT

A method for remanufacturing an electronic assembly allows the assembly to be disassembled, tested and reassembled despite certain components being permanently affixed to a housing of the assembly. The electronic assembly includes a circuit assembly within the housing. During remanufacture, a first portion of the housing is removed to expose a first side of the circuit assembly and a second portion of the housing is removed to expose a second side of the circuit assembly. When removing the second portion of the housing, one of the components of the circuit assembly may also be removed. During remanufacture a connector assembly including a replacement component substantially similar to the removed component, and including one or more pins connected to the replacement component and situated to mate with one or more empty sockets of the circuit assembly is used to facilitate testing of the assembly.

13 Claims, 8 Drawing Sheets

REMANUFACTURE OF ELECTRONIC ASSEMBLIES

TECHNICAL FIELD

This patent disclosure relates generally to the remanufacture of electronic assemblies, and, more particularly, to a system for remanufacturing electronic assemblies wherein one or more electrical components of the assembly is removed prior to testing of the assembly.

BACKGROUND

With the advent of integrated electronics, electrical circuits have largely eliminated mechanical and electromechanical features in many applications, reducing the maintenance and adjustment chores associated with such applications. However, these electrical circuits as well as the mechanical aspects of the circuit housing, attachment points, and so on, may still occasionally require maintenance, adjustment, or even replacement. For example, power circuits may be exposed to excess heat and may be degraded. Vibration and other mechanical forces may affect the circuits and/or their housings or their connections to other circuit elements.

However, due to the relative permanence of integrated-circuit assemblies, these assemblies are not often configured for easy disassembly, and disassembly may even require removal of one or more components from a board of the assembly. For example it is often advantageous to affix certain components to a housing or other nearby structure for purposes of heat transfer, mechanical support, and so on. However, by joining the board and housing in a semi-permanent manner, this practice can render one side of the board inaccessible, requiring removal of components to allow the remainder of the board to be accessed for inspection and repair. In such cases, the board no longer presents a fully functional device and it becomes difficult to test the remaining components.

Most of the testing solutions available today are directed to the testing of new boards being assembled rather than the testing of completed boards being disassembled for reconditioning, and thus are less than ideal for use in the context of remanufacturing and repair. For example, U.S. Pat. No. 6,486,686 to Fukasawa describes a bare-chip LSI mounting board test apparatus for testing a single chip (LSI) mounted on a board prior to mounting other components. The Fukasawa tester boards incorporate all other parts that will eventually be used on the LSI board and are interfaced to the LSI board via probes. In this state, a test signal is transmitted from a controller through the test boards to the LSI board to test the mounted LSI chip. However, this system requires that the board under test contain only a single chip (the LSI) which is generally not the case in the context of partial disassembly for remanufacture. In addition, rather than allowing the board under test to interface as it normally would, the board is forced to interface indirectly through the Fukasawa test boards, increasing complexity in the fixture and allowing additional avenues for inadvertent error.

SUMMARY

The disclosure describes, in one aspect, a method for remanufacturing an electronic assembly, the assembly including a housing having therein a circuit assembly comprising a plurality of components. In an example, the method comprises removing a first portion of the housing to expose a first side of the circuit assembly, removing a second portion of the housing to expose a second side of the circuit assembly, wherein removing the second portion of the housing includes removing at least one of the plurality of components, and placing the circuit assembly into a test fixture. The test fixture includes a test frame for receiving the circuit assembly, at least one connector assembly affixed to the test frame, the connector assembly including a replacement component substantially similar to the removed at least one of the plurality of components, and one or more pins connected to the replacement component and situated to mate with the one or more empty sockets of the circuit assembly when the circuit assembly is received in the test frame. Once the circuit assembly is placed in the fixture, the circuit assembly can be tested as if the at least one component had not been removed (e.g., a non-disassembled part).

In another aspect, the disclosure describes a test fixture for testing a partially disassembled circuit assembly. At least one component has been removed from the circuit assembly to create the partially disassembled circuit assembly, creating one or more empty sockets caused by the removal. In the described example, the test fixture comprises a test frame for having the partially disassembled circuit assembly affixed thereto. In addition, the test fixture comprises one or more connector assemblies affixed to the test frame, wherein each of the one or more connector assemblies comprises a replacement component similar in operation to the at least one removed component, and one or more pins connected to the replacement component and situated to mate with the one or more empty sockets of the partially disassembled circuit assembly when the partially disassembled circuit assembly is affixed to the test frame, whereby the partially disassembled circuit assembly can be tested as if the at least one component had not been removed.

In a further aspect, the disclosure describes a method for testing a partially disassembled circuit assembly that has had one or more components removed, so that the partially disassembled circuit assembly may be tested as if the one or more components had not been removed. The method comprises mounting the partially disassembled circuit assembly in a test frame, wherein the test frame comprises a one or more respective replacement components for each of the one or more removed components and a connector assembly for connecting the one or more respective replacement components to the circuit assembly at locations from which the one or more removed components were taken. Subsequently, the method comprises testing the partially disassembled circuit assembly as if the one or more removed components had not been removed from the circuit board.

Further features of various described embodiments will be appreciated from the remainder of this disclosure including the attached figures.

DETAILED DESCRIPTION

This disclosure relates primarily to a system for remanufacturing circuit board assemblies and other electrical assemblies that require selective removal of one or more components from the assembly, e.g., for access to a portion of the assembly for repair or analysis. In general terms, the remanufacturing process with respect to a circuit assembly entails disassembly and testing of the assembly and/or portions thereof to identify remedial actions to be taken. The tested assembly is then reconditioned by adjustment or replacement of one or more parts or components pursuant to the testing or analysis performed, after which the part is reassembled and tested.

Typically, electronic assemblies such as ECUs that are intended for use in industrial or other demanding environments comprise an active portion, e.g., a printed circuit board, as well as a housing that protects the active portion from the ambient environment. Thus, this housing is typically removed to allow access to the active portion of the assembly for analysis, inspection, repair, and so on. However, in some cases, certain components of the active portion of the assembly may be affixed to a portion of the housing, so that the housing cannot be readily removed. For example, it is often advantageous to affix transistors, voltage regulators, and other power electronic components to the housing for purposes of heat transfer, mechanical support, and so on. Typically, a strong heat-conductive epoxy or other structural adhesive is used to attach the power electronic component to the housing. As such, it is difficult to mechanically separate the power electronic component from the housing to provide access to the board as a whole. In an illustrated embodiment, such components remain affixed to the housing and are instead detached from the board to allow access to the remainder of the board.

Figure 7:
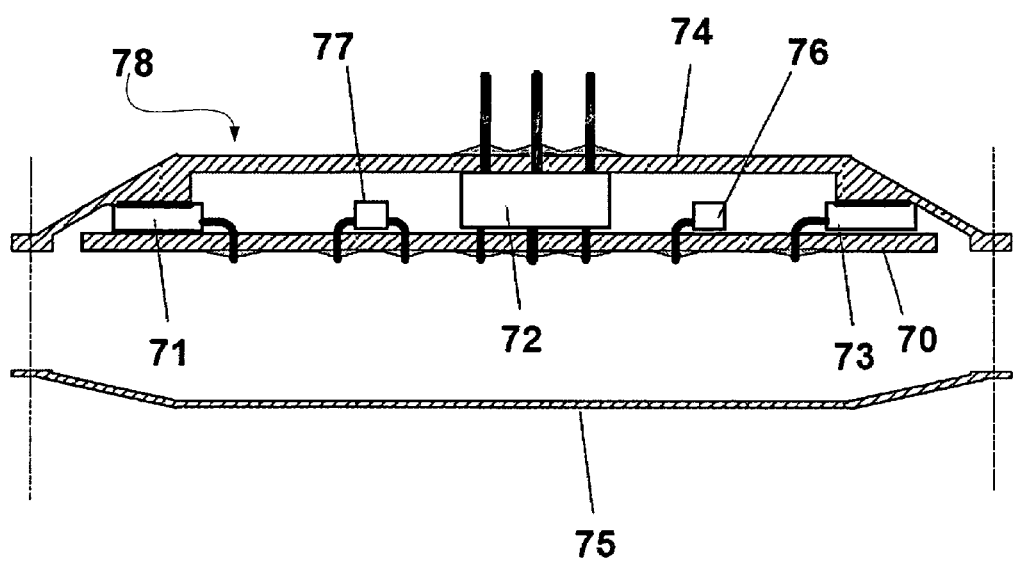
FIG. 7 is a cross-sectional side view of an electronic assembly remanufacturable in accordance with the principles disclosed herein.

An example of such an arrangement is shown in the cross-sectional side view of an electronic assembly 78 FIG. 7. A number of components 71, 72, 73 are attached to a top portion 74 of a clamshell type housing 79 that also comprises a mating bottom portion 75. In this type of assembly, other components 76, 77 on the circuit assembly 70 are inaccessible for repair or replacement until the components 71, 72, 73 are desoldered so that the housing 74 (and components 71, 72, and 73) may be lifted away from the board 70. Typically the bottom portion 75 is removably held to the top portion 74 via screws, clamps, or other fastening means as will be appreciated by those of skill in the art.

Figure 1:
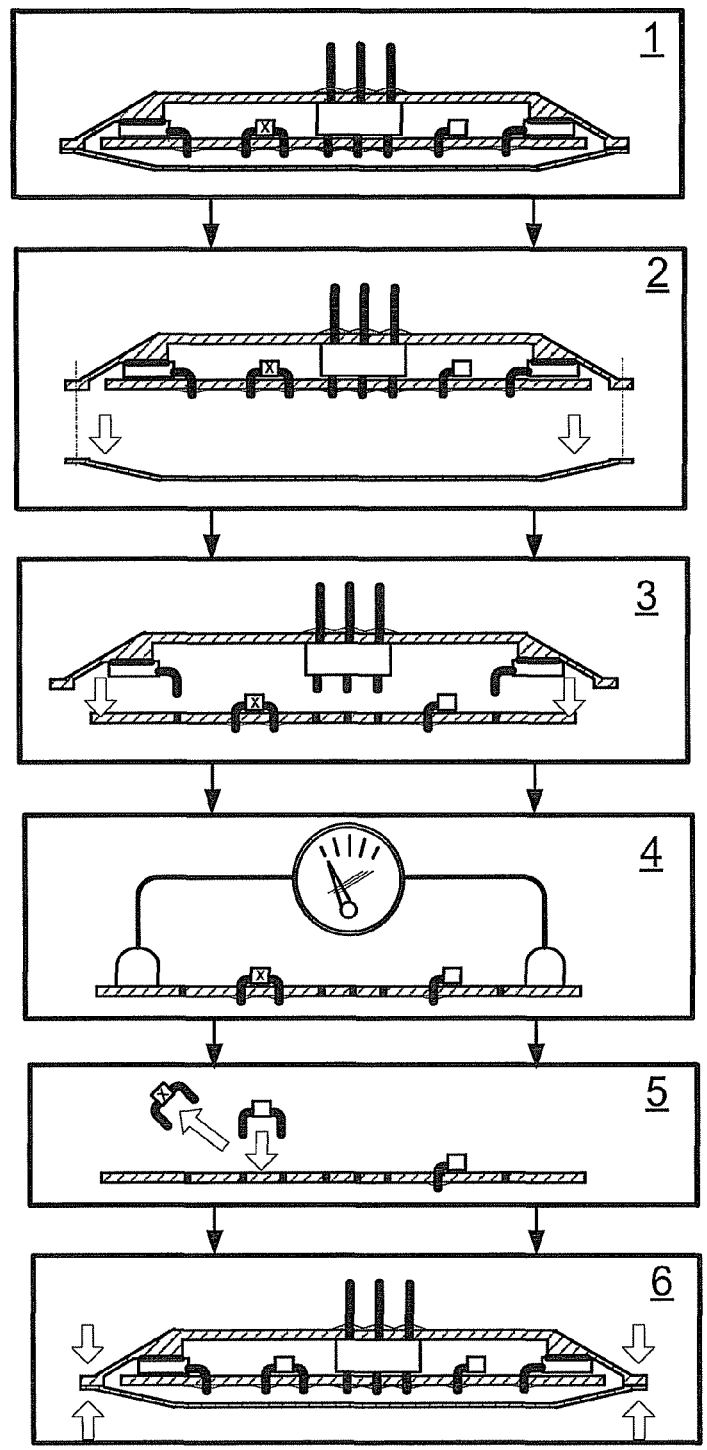
FIG. 1 is a schematic overview of a remanufacturing process for an electronic assembly with circuit boards having one or more components affixed to a housing of the assembly.

FIG. 1 is a schematic overview of a remanufacturing process for electronic assemblies. At stage 1, an electronic assembly such as an engine control unit (ECU) is provided for remanufacturing. For example, defective or outdated assemblies can be provided to a remanufacturing facility by a service facility. At stage 2, the electronic assembly housing is opened. In the illustrated example, the electronic assembly comprises a clam shell housing such as illustrated in FIG. 7 that is opened to access the circuit components of the assembly. In the case of an assembly wherein certain component are affixed to an upper portion of the clam shell housing, desoldering or other detachment of these components from the board at stage 3 allows the board to be separated from the upper portion of the clam shell housing, so that the other components on the board are no longer hidden by the upper portion of the clam shell housing and may be examined.

At stage 4 the board is tested to identify a defective component, which may then be replaced at stage 5. Finally, the disassembled electronic assembly is reassembled at stage 6 to form a remanufactured electronic assembly. The unit is optionally tested again after reassembling to ensure proper operation before the unit is sold or otherwise placed back into service.

Figure 2:
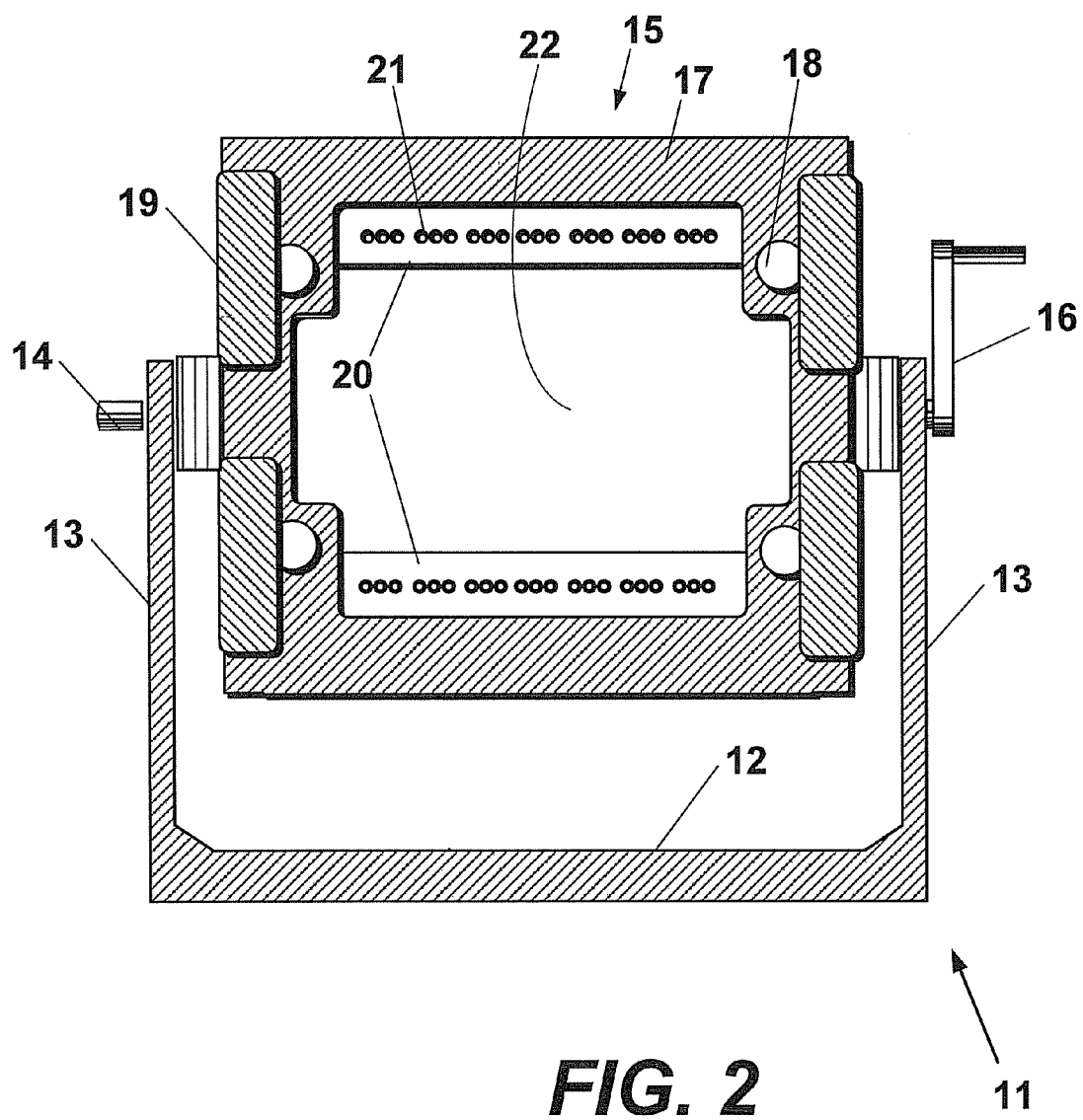
FIG. 2 is a perspective front view of a circuit testing fixture for use in accordance with the principles disclosed herein.

An example of a test fixture 11 in accordance with the principles disclosed herein is shown in the cross-sectional side view illustration of FIG. 2. The test fixture 11 comprises a number of components including a base 12 and one or more support arms 13. The support arms 13 are adapted to bear pegs 14 that are connected to a test mount 15. In this manner, the test mount 15 is rotatable within the fixture 11 and may be manipulated, e.g., via an arm 16 or other grip or lever. In an embodiment, the fixture 11 incorporates one or more set screws (not shown) or other means to prevent rotation of the test mount 15 within the fixture 11.

The test mount 15 comprises a frame 17 that supports a number of further features of the fixture 11. In the illustrated embodiment, the frame 17 supports one or more pads 18 for supporting a board under test (not shown in FIG. 2) within the fixture 11 and one or more clamps 19 for holding the board under test against the pads 18. The frame 17 further has mounted thereon one or more connector boards 20. As will be described in greater detail later, the connector boards 20 include one or more chips or circuits (not visible in the top view of FIG. 2) that are exposed to the board under test via a plurality of pins 21. The pins may comprise a telescoping section operating along a common axis, that interact with the circuit under test via friction fit or otherwise.

The illustrated frame 17 embodies a centrally located opening 22 to allow access to the underside of the board under test when the board under test is clamped in the fixture 11. The shape of the central opening 22 is not critical, but it preferably allows enough clearance so that all components or connections of interest are accessible to an operator. In an embodiment, the central opening 22 may be omitted.

Figure 3:
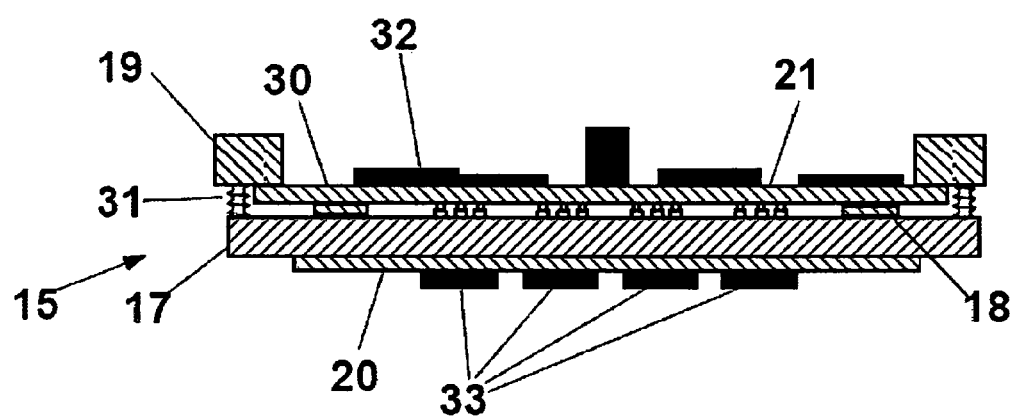
FIG. 3 is a cross-sectional side view of a test frame and circuit under test for use in accordance with the principles disclosed herein, wherein the circuit under test is affixed to the test frame.

The operation and further features of the fixture 11 and its use will be more fully appreciated from the cross-sectional side view of FIG. 3, which presents a cross-section of the test mount 15. As can be seen from FIG. 3, a circuit board 30 is situated within the test mount 15 against the pads 18 of the frame 17. The clamps 19 act to hold the board 30 in place positionally on the frame 17. The clamps 19 may operate via spring tension, either downwardly or laterally against the board 30, or may be moved into position via screws 31 or other means as will be appreciated by those of skill in the art. With the board under test 30 clamped in the frame 17, the pins 21, which pass through the opening 22 (not visible in FIG. 3) in the frame 17, are under longitudinal tension and are thus biased into contact with the board 30. In an embodiment, the pins 21 comprise telescoping spring loaded assemblies that compress and/or are placed under tension when the board under test 30 is pressed against the frame 17. An example of such a pin is described elsewhere herein in greater detail with reference to FIG. 8.

The pads 18 allow some degree of resilience to compensate for changing tolerances and slight loosening of components.

In addition, the pads 18 also serve to electrically insulate the board under test 30 from the frame 17 so that the components of the board under test 30 do not short out against the frame 17 or otherwise have their operation affected by the fixture 11.

The circuit board 30 comprises a nonconductive baseboard formed from a material such as glass, phenolic, fiberglass, plastic, fiber reinforced plastic, etc. For connecting various components to the board 30, the board 30 typically comprises a number of metallic paths or "traces" adhered to one or both sides of the baseboard 30. The circuit board 30 further comprises electrical components 32 mounted on a top surface of the board 30. Such electrical components can include resistors, transistors, capacitors, inductors, switches, relays, connector blocks, integrated circuits, and any other electrical components whether discrete or integrated, active or inactive as needed to fulfill the requirements for the operation of the circuit board 30. Typically, one or more of the electrical components comprise leads that extend through the board 30 to extend out the underside of the board 30.

The traces by which components are attached to the circuit board 30 may be located on the top side of the board, e.g., the side whereupon the components 32 reside in the illustrated embodiment of FIG. 3, or may be located on the opposite side of the board 30. In the illustrated example, the board under test 30 has been partially disassembled by the removal of four transistors having three leads each. Thus, the connector boards 20 have three replacement transistors 33 mounted thereon. For each transistor 33, the three leads are connected to a respective three of the pins 21 exposed to the circuit board 30. Thus, when the circuit board 30 resides in the fixture 11, the missing transistors are effectively substituted by the replacement transistors 33 of the connector boards 20 so that the operation of the circuit board 30 may be fully tested.

Figure 4:
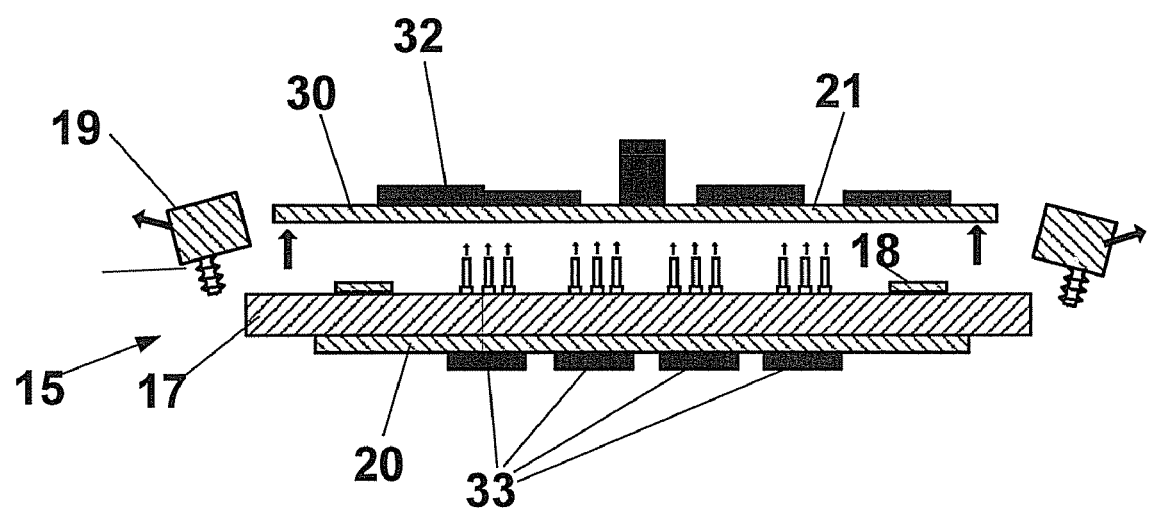
FIG. 4 is a cross-sectional side view of a test frame and circuit under test for use in accordance with the principles disclosed herein, wherein the circuit under test is released from the test frame.

To better appreciate the operation and functionality of the various components shown in FIG. 3, the cross-sectional side view of FIG. 4 shows the circuit assembly 30 under test (i.e., "circuit under test") removed from the frame 17. As can be seen, the pins 21 have decompressed and are thus slightly extended compared to their compressed state. In the illustrated configuration, the board 30 has been removed to the extent that the pins 21, although extended, no longer contact the board 30. The clamps 19 are shown removed, although it is contemplated that hinged clamps that pivot without removal may alternatively be used.

Figure 5:
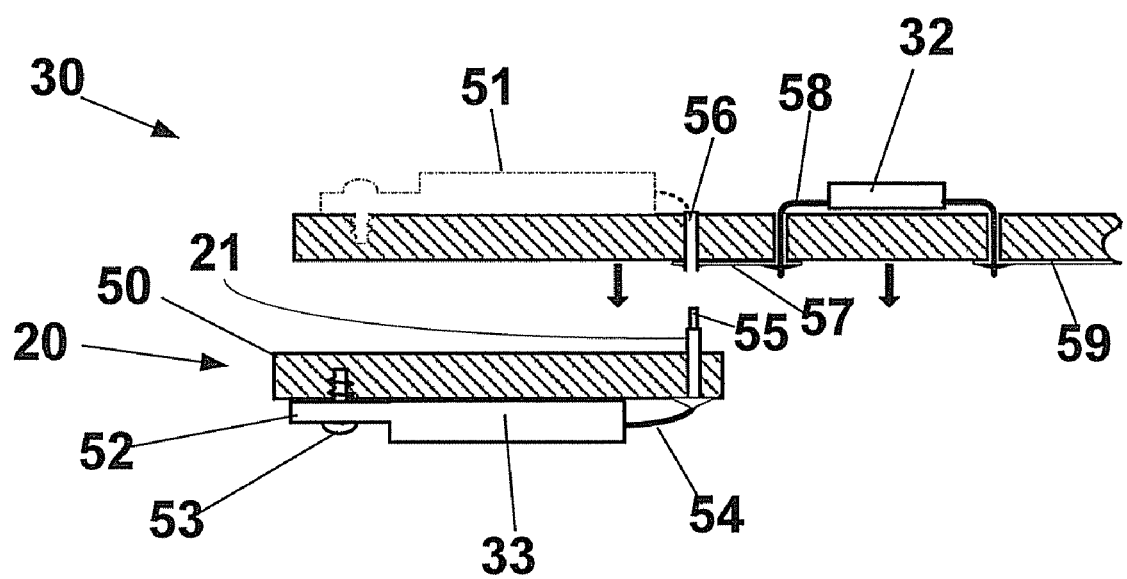
FIG. 5 is a cross-sectional enlarged partial side view of a connector board and circuit under test for use in accordance with the principles disclosed herein.

A connector board 20 is illustrated in further detail in FIG. 5, which presents a cross-section of the connector board 20 and a portion of the circuit board under test 30. It should be noted that although two connector boards 20 are employed in the illustrated embodiments and the illustrated connector boards 20 are symmetrical, there is no requirement that this be the case, and the connector boards 20 may alternatively be different in the configuration and number of boards 20 and/or components on the board(s) 20.

As shown in FIG. 5, the connector assembly 20 (e.g., connector board) comprises a substrate 50, which may be the same or similar nonconductive material as the baseboard of the circuit under test 30, e.g., glass, phenolic, fiberglass, plastic, fiber reinforced plastic, etc. In the illustrated embodiment, the connector board 20 further comprises one or more replacement transistors 33, which substitute for corresponding transistors removed from the circuit board under test 30 as indicated by outline 51. The replacement transistors 33 comprise a mounting tab 52 which is attached to the substrate 50 via a screw 53 or other means. The replacement transistors 33 comprise three leads 54, one of which can be seen in FIG. 5. Each lead of the one or more replacement transistors 33 is soldered or otherwise affixed to the base of a respective pin 21 so that at least the tip 55 of the pin 21 is in a conductive relationship with the respective lead of the associated replacement transistor 33.

The circuit under test 30 comprises a socket 56 where the replaced transistor 51 was previously connected to the circuit under test 30. As in the circuit prior to disassembly, the socket 56 is soldered or otherwise affixed to a metallic trace 57 on the board of the circuit under test 30. In turn, the trace 57 remains linked to other circuitry, e.g., component 32, on the board of the circuit under test 30 via soldered lead 58. The component 32 may be further linked to other components (not shown) via another metallic trace 59.

During use, as the circuit under test 30 is pressed into fixture 11, the socket 56 compresses the pin 21 along its length, creating a spring-biased contact between the socket 56 and the pin 21. This effectively brings the replacement transistor 33 into the circuit 30 in place of the removed transistor 51. In an alternative embodiment, the socket 56 cooperates with the pin 21 in a frictional surrounding relationship rather than by compressing it. In this embodiment, the relative dimensions of the socket 56 and pin 21 are preferably coordinated to allow a relatively tight fit. If the fit between the socket 56 and pin 21 is overly loose, the necessary contact may be absent or intermittent, while if the fit is overly tight, the user may be unable to easily press the circuit 30 into the fixture 11.

Figure 6:
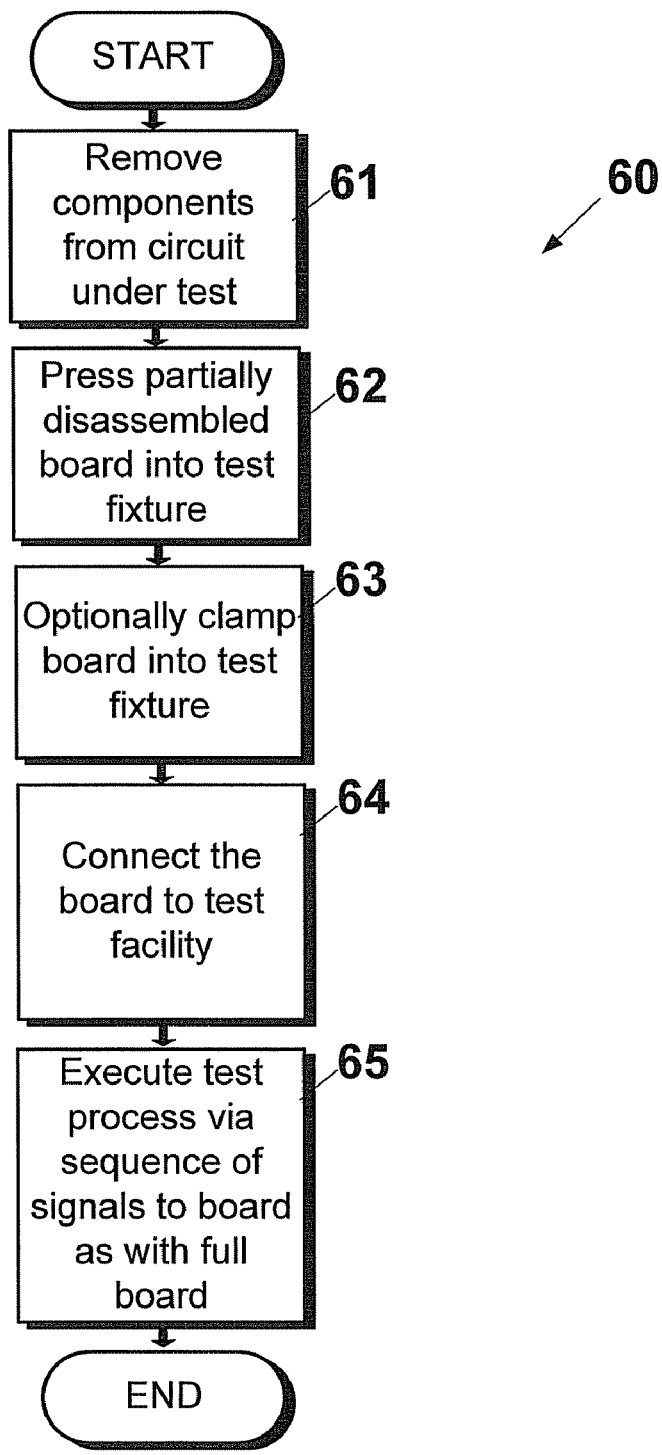
FIG. 6 is a flow chart illustrating a method of testing a disassembled circuit in accordance with the principles disclosed herein.

The fixture illustrated and discussed above enables a user to easily test a partially disassembled circuit without requiring the user to change the manner in which he or she connects other circuitry to the board and without requiring the user to reassemble the board. The flow chart of FIG. 6 illustrates a process of using the fixture 11 according to an embodiment, although it is contemplated that other modes of usage will be apparent to those of skill in the art based on the foregoing disclosure. Referring to the process 60 of FIG. 6, a user or appliance removes one or more components from a circuit under test at stage 61. This may be done for one or more of many reasons, including allowing access to the remainder of the circuit or isolating defects in the removed components from defects due to the remaining components and structure of the board.

At stage 62, the user or appliance presses the partially disassembled board into a fixture such as that described above, and the board is optionally affixed to the fixture at stage 63. The user or appliance then connects the board to a test facility in stage 64 in the same manner as would be used if the board had not been partially disassembled. For example, if the test protocol normally consists of connecting a 24-pin socket to a mating pin set on the board, then that is also how the partially disassembled board under test is connected in process 60.

Finally, at stage 65, the user or appliance executes a test process by sending a predetermined sequence of signals to the board via the connection made in stage 64. Those of skill in the art will be aware of existing test sequences that may be sent to different types of boards to test them in the assembled state, and any such test sequences may be used in stage 65.

Figure 8:
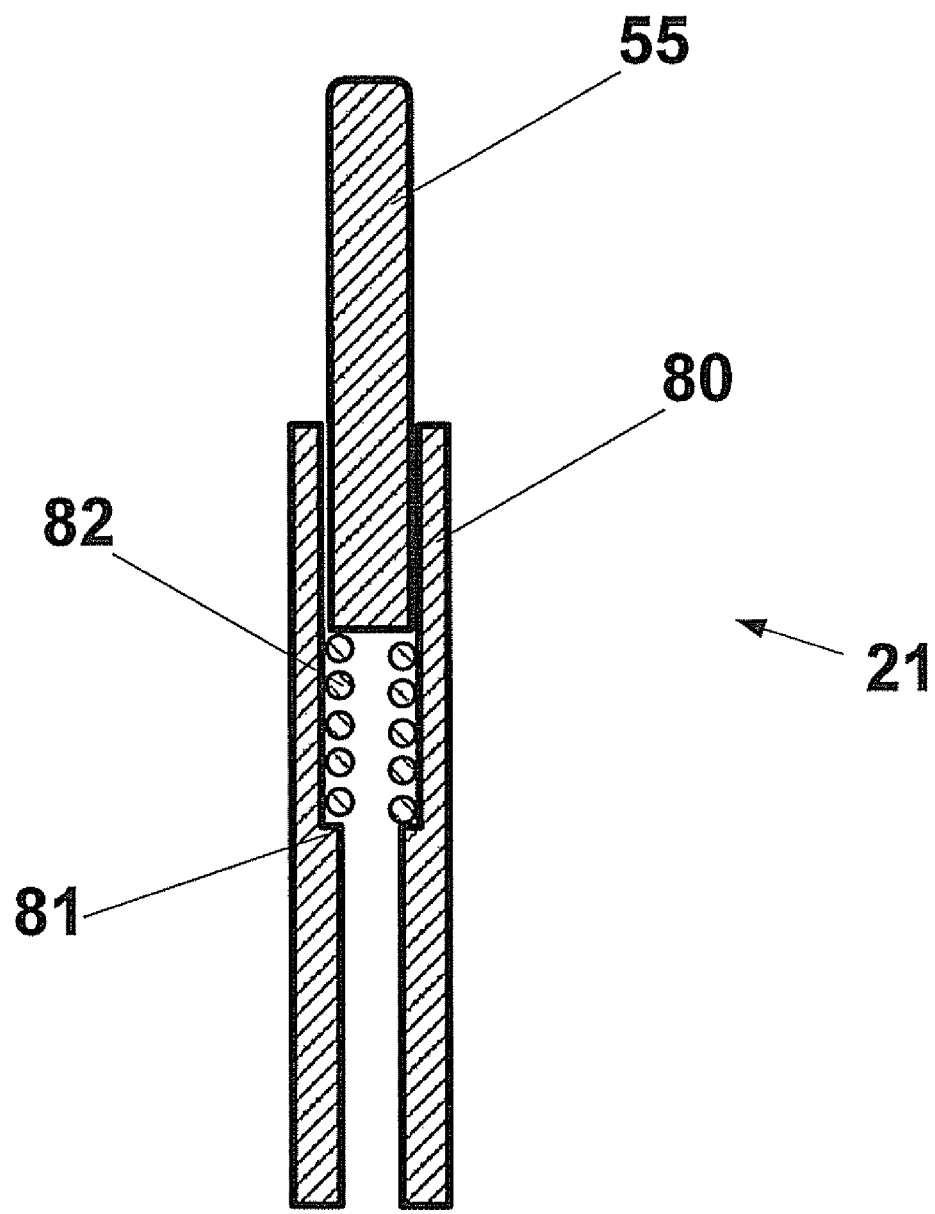
FIG. 8 is a cross-sectional side view of a spring-loaded pin usable in accordance with the described principles.

Although any type of spring-loaded pin may be used as pin 21 in accordance with the described principle, an example pin 21 is illustrated in detail in the cross-sectional side view of FIG. 8. In the illustrated example, the pin 21 is cylindrical and comprises a tip 55 and a sheath 80. The sheath 80, which may be tubular, is configured to surround the pin 21 in a coaxial relationship. Although illustrated as electrically isolated for clarity, the tip 55 and sheath 80 are a least partially in electrical contact with one another. A shoulder 81 within the sheath 80 acts as an axial stop for spring 82. The spring 82 biases the tip 55 in an upward direction, but is limited either by its relaxed length or a further stop so that the tip 21 and sheath 80 of the pin 21 remain connected even in the absence of external compression.

INDUSTRIAL APPLICABILITY

The present disclosure is applicable to the remanufacture of electronic assemblies wherein one or more electrical components of the assembly is removed prior to testing and repair of the assembly. The electronic assembly may be of any type desired, but in an illustrated embodiment the electronic assembly is an Engine Control Unit (ECU) that comprises a plurality of transistors. The transistors may be glued or otherwise affixed to a housing of the ECU such that the components of the circuit board are largely inaccessible.

Such a configuration is shown in FIG. 7. In particular, as shown in FIG. 7, the transistors and other components 71, 72, 73 are attached to a top portion 74 of a clamshell type housing that also comprises a mating bottom portion 75. In this type of assembly, other component 76, 77 on the board 70 are inaccessible for repair or replacement until the components 71, 72, 73 are decoupled from the board 70 so that the top portion 74 may be lifted away by elevating the part. Typically the bottom portion 75 of the housing is removably fixed to the top portion 74 via screws, clamps, or other fastening means as will be appreciated by those of skill in the art, allowing access to the inside of the housing to desolder or otherwise decouple the components to be removed.

The system described herein is advantageously capable of replicating a full circuit during remanufacture even though an electronic assembly may have been partially disassembled. The system disclosed herein further advantageously allows testing of the disassembled circuit in the same manner, e.g., via the same protocols and test sequences as would be used for the full circuit.

In the disclosed example, a test mount for use during remanufacture comprises a test frame rotatably mounted to allow access to the top and bottom of the circuit under test. The frame has a central opening to allow access, and comprises a plurality of clamps to retain the circuit under test during analysis as well as a plurality of pads to isolate the circuit from the frame. One or more connector boards affixed to the frame present a number of pins associated with replacement components on the connector boards so that the circuit under test will behave as a full circuit, and can be tested via the same protocols and test sequences as would be used for the full circuit.

It will be appreciated that the foregoing description provides examples of the disclosed system, structures, and techniques. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated. All methods described herein can be performed in any suitable order unless otherwise indicated herein or otherwise clearly contradicted by context. The term "plurality" is used to indicate more than one item, while the terms "at least one" and "one or more" are used to indicate one item or more than one item.

Accordingly, this disclosure includes all modifications and equivalents of the subject matter recited in the claim or claims appended hereto as permitted by applicable law. Moreover, any combination of the above-described elements in all possible variations thereof is encompassed by the disclosure unless otherwise indicated herein or otherwise clearly contradicted by context.

We claim:

1. A method for remanufacturing an electronic assembly, the assembly including a housing having therein a circuit assembly comprising a plurality of components, the method comprising:
    removing a first portion of the housing to expose a first side of the circuit assembly;
    removing a second portion of the housing to expose a second side of the circuit assembly, wherein removing the second portion of the housing includes removing at least one of the plurality of components;
    placing the circuit assembly into a test fixture including a test frame for receiving the circuit assembly, at least one connector assembly affixed to the test frame, the connector assembly including a replacement component substantially similar to the removed at least one of the plurality of components, and including one or more pins connected to the replacement component and situated to mate with the one or more empty sockets of the circuit assembly when the circuit assembly is received in the test frame; and
    testing the circuit assembly as if the at least one component had not been removed.

2. The method according to claim 1, further comprising reconditioning the circuit assembly.

3. The method according to claim 1, further comprising reassembling the circuit assembly and the first and second portions of the housing to form a remanufactured electronic assembly.

4. The method according to claim 1, wherein placing the circuit assembly into a test fixture further comprises clamping the circuit assembly to the test frame.

5. The method according to claim 4, wherein placing the circuit assembly into a test fixture further comprises placing the circuit assembly against a plurality of electrically isolating pads affixed to the test frame.

6. The method according to claim 1, wherein the removed at least one of the plurality of components comprises a transistor and the replacement component also comprises a transistor.

7. The method according to claim 1, wherein the one or more pins are spring loaded to at least partly compress when the circuit assembly is placed in the test fixture.

8. The method according to claim 1, wherein the one or more pins form a friction fit with the one or more empty sockets of the circuit assembly.

9. A method of using and processing an engine control unit having a housing and a circuit assembly therein comprising a plurality of components, the method comprising:
    installing the engine control unit into a machine unit;
    using the engine control unit to control an engine of the machine unit;
    removing the engine control unit from the machine unit;
    removing a first portion of the housing to expose a first side of the circuit assembly;
    removing a second portion of the housing to expose a second side of the circuit assembly, wherein removing the second portion of the housing includes removing at least one of the plurality of components;
    placing the circuit assembly into a test fixture including a test frame for receiving the circuit assembly, at least one connector assembly affixed to the test frame, the connector assembly including a replacement component substantially similar to the removed at least one of the plurality of components, and including one or more pins connected to the replacement component and situated to mate with the one or more empty sockets of the circuit assembly when the circuit assembly is received in the test frame; and testing the circuit assembly as if the at least one component had not been removed.

10. The method according to claim 9, further comprising reconditioning the circuit assembly.

11. The method according to claim 10, further comprising reassembling the circuit assembly and the first and second portions of the housing to form a remanufactured engine control unit.

12. The method according to claim 11, further comprising installing the remanufactured engine control unit into a machine unit.

13. The method according to claim 12, further comprising controlling an engine of the machine unit via the remanufactured engine control unit.

* * * * *